(12) United States Patent
Lopp et al.

(10) Patent No.: US 11,905,589 B2
(45) Date of Patent: Feb. 20, 2024

(54) MATERIAL DEPOSITION APPARATUS HAVING AT LEAST ONE HEATING ASSEMBLY AND METHOD FOR PRE- AND/OR POST-HEATING A SUBSTRATE

(71) Applicant: Applied Materials, Inc., Santa Clara, CA (US)

(72) Inventors: Andreas Lopp, Freigericht (DE); Stefan Bangert, Steinau (DE); Wolfgang Buschbeck, Hanau (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/998,872

(22) Filed: Aug. 20, 2020

(65) Prior Publication Data
US 2022/0056575 A1 Feb. 24, 2022

(51) Int. Cl.
*C23C 14/24* (2006.01)
*C23C 14/56* (2006.01)
*C23C 14/54* (2006.01)
*C23C 14/26* (2006.01)

(52) U.S. Cl.
CPC .............. *C23C 14/26* (2013.01); *C23C 14/24* (2013.01); *C23C 14/541* (2013.01); *C23C 14/562* (2013.01)

(58) Field of Classification Search
CPC .......... C23C 14/541; C23C 14/56–562; C23C 16/54–545; C23C 14/26; C23C 14/243
USPC .................................................. 118/715–733
See application file for complete search history.

(56) References Cited

U.S. PATENT DOCUMENTS

| | | | |
|---|---|---|---|
| 2003/0145792 A1 | 8/2003 | Honda et al. | |
| 2005/0008778 A1 | 1/2005 | Utsugi et al. | |
| 2005/0072361 A1* | 4/2005 | Yang | C23C 14/246 427/248.1 |
| 2010/0068382 A1* | 3/2010 | Strobel | C23C 16/18 427/255.6 |
| 2010/0291308 A1* | 11/2010 | Sferlazzo | C23C 14/541 427/398.1 |
| 2011/0014519 A1* | 1/2011 | Okazaki | C23C 14/562 427/58 |
| 2014/0024172 A1* | 1/2014 | Rathweg | C23C 14/5806 257/E21.462 |
| 2014/0212599 A1* | 7/2014 | Buschbeck | H01J 37/3277 118/712 |
| 2015/0158048 A1* | 6/2015 | Ries | C23C 14/562 427/172 |
| 2017/0267534 A1* | 9/2017 | Harutyunyan | C23C 16/01 |

FOREIGN PATENT DOCUMENTS

| | | |
|---|---|---|
| CN | 102766843 A | 11/2012 |
| JP | 10-226877 A | 8/1998 |
| JP | 11-323535 A | 11/1999 |

OTHER PUBLICATIONS

International Search Report and Written Opinion dated Dec. 3, 2021 for Application No. PCT/US2021/045261.

* cited by examiner

*Primary Examiner* — Aiden Lee
(74) *Attorney, Agent, or Firm* — Patterson + Sheridan, LLP (57) ABSTRACT

One or more heating assemblies for a material deposition apparatus for pre-heating a substrate before entering a material deposition area and/or for post-heating the substrate after exiting the material deposition area are described.

12 Claims, 4 Drawing Sheets

MATERIAL DEPOSITION APPARATUS HAVING AT LEAST ONE HEATING ASSEMBLY AND METHOD FOR PRE- AND/OR POST-HEATING A SUBSTRATE

FIELD

Embodiments of the present disclosure relate to substrate coating by thermal evaporation in a vacuum chamber. Embodiments of the present disclosure further relate to material deposition of evaporated material onto a substrate, particularly for the manufacture of batteries. Embodiments of the present disclosure relate to one or more heating assemblies for a material deposition apparatus for pre-heating a substrate before entering a material deposition area and/or for post-heating the substrate after exiting the material deposition area.

BACKGROUND

Various techniques for deposition on a substrate, for example, chemical vapor deposition (CVD) and physical vapor deposition (PVD) are known. For deposition at high deposition rates, thermal evaporation may be used as a PVD process. For thermal evaporation, a source material is heated up to produce a vapor that may be deposited, for example, on a substrate. Increasing the temperature of the heated source material increases the vapor concentration and can facilitate high deposition rates. The temperature for achieving high deposition rates depends on the physical properties of the source material, e.g. vapor pressure as a function of temperature, and substrate physical limits, e.g. melting point.

The deposition of a metal, e.g. lithium, on a flexible substrate, e.g. on a copper substrate, by evaporation may be used for the manufacture of batteries, such as Li-batteries. For example, a lithium layer may be deposited on a thin flexible substrate for producing the anode of a battery. After assembly of the anode layer stack and the cathode layer stack, optionally with an electrolyte and/or separator therebetween, the manufactured layer arrangement may be rolled or otherwise stacked to produce the Li-battery.

The material to be deposited is heated up to high temperatures and provides a high heat load to the substrate to be coated. Sudden or abrupt temperature changes may negatively influence the substrate. It is thus beneficial, to provide an improved material deposition apparatus to at least partially overcome the problems in the art.

SUMMARY

According to one embodiment, a material deposition apparatus for depositing an evaporated material onto a substrate is provided. The material deposition apparatus includes a substrate transportation device for transporting the substrate along a substrate transportation direction. The material deposition apparatus includes an evaporation source assembly that is disposed along the substrate transportation direction for providing the evaporated material to the substrate, the evaporation source assembly having a deposition area for depositing material onto the substrate. The material deposition apparatus includes at least a first heating assembly disposed along the substrate transportation direction. The first heating assembly is configured to provide a first heating area for heating the substrate, wherein the first heating area is located directly adjacent to the deposition area of the evaporation source assembly.

According to one embodiment, a method for depositing a material onto a substrate is provided. The method includes transporting the substrate on a substrate transportation device along a substrate transportation direction, wherein the substrate has a first temperature. The method also includes heating the substrate to a second temperature at a first heating area, the first heating area being located directly adjacent to a deposition area of an evaporation source assembly. The method further includes depositing material onto the substrate at the deposition area of the evaporation source assembly.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the present disclosure are also directed at methods for operating the described apparatus. It includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The embodiments provided herein relate to thin film coating by evaporation, particularly to thin film coating in a vacuum chamber. Typically, the material to be coated is heated up to a material-specific temperature to be evaporated. In general, higher evaporation rates can be provided at higher temperatures. The respective temperature for a specific coating rate depends amongst others e.g. on the material vapor pressure. For high deposition rate processes the condensation heat load of the material may dominate the heat load on the substrate.

In evaporation systems, the evaporated material will condensate on surfaces of the system components having a lower temperature than the evaporated material. For thermal coating of a substrate, the substrate includes a lower temperature such that the evaporated material may be deposited or coated onto the substrate to form a thin layer on the substrate. However, when the difference between the temperature of the substrate and the temperature of the material to be coated is large, the resulting thin layer or film may be damaged, e.g. ripped, or may produce wrinkles on its surface.

It is therefore beneficial to provide systems, apparatuses and methods that provide a heating for the substrate, particularly, a heating for the substrate before entering the deposition area of an evaporation source assembly, i.e. a pre-heating for the substrate and/or a heating for the substrate after exiting the deposition area of an evaporation source assembly, i.e. a post heating for the substrate. According to some embodiments, the pre-heating or the post-heating provides a smooth temperature ramp before or after the materials deposition, respectively.

The systems, apparatuses and methods described herein provide heat to the substrate before and after material deposition thereon. Accordingly, a better distribution of temperature or heat may be provided for the substrate by pre-heating and/or a post-heating the substrate to be coated. In other words, the temperature of the substrate may be adjusted or controlled. Doing so allows the substrate to receive a smooth or seamless temperature transition between an area in which no material deposition occurs and an area in which material is deposited thereon, i.e. spatially before the deposition area and spatially thereafter. This allows to influence the shape of the temperature profile of the substrate. Thus, the temperature of the substrate may be smoothly, uniformly, slowly or gradually increased before material is deposited onto the substrate.

Figure 1:
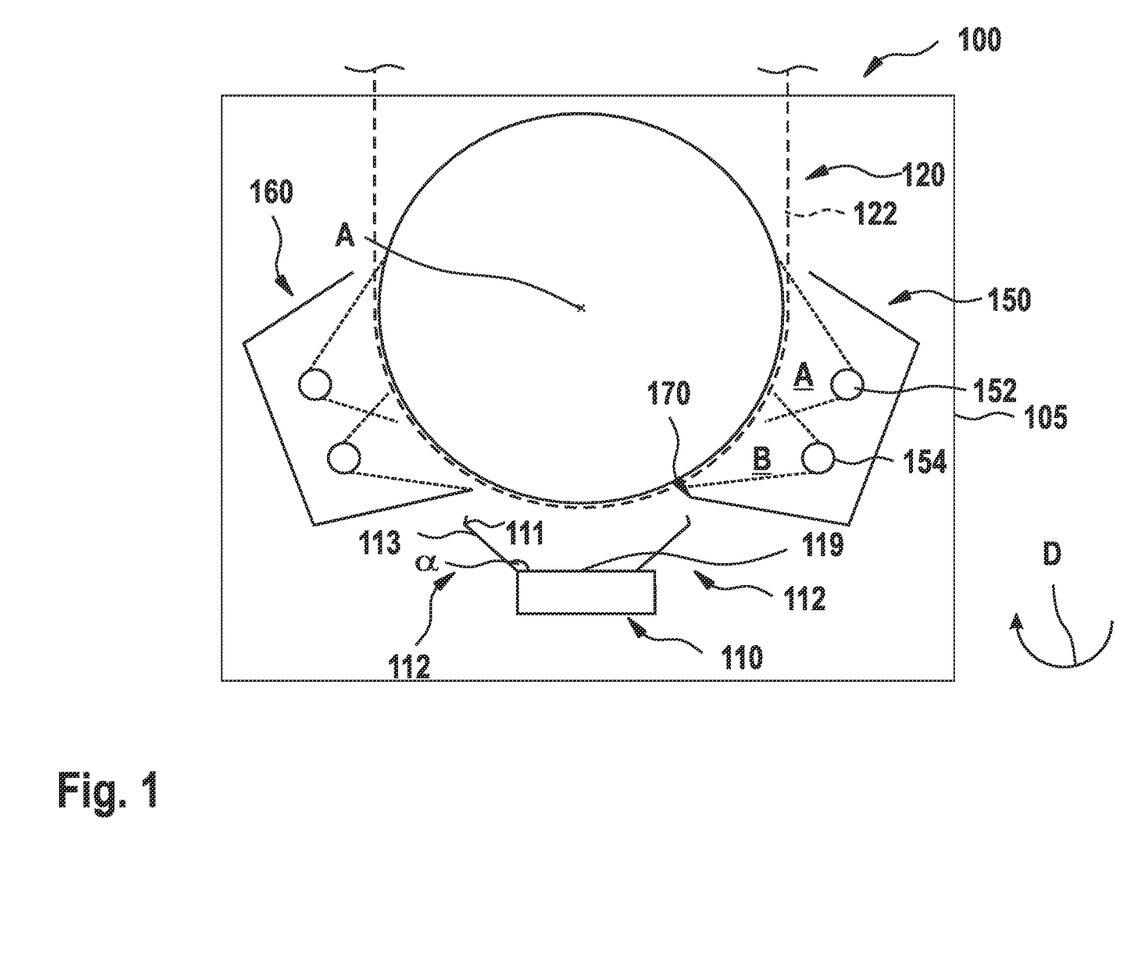
FIG. 1 shows a schematic view of a material deposition apparatus according to embodiments described herein.

FIG. 1 exemplarily shows a material deposition apparatus according to embodiments described herein that can be combined with any other embodiment described herein. The material deposition apparatus 100 may include a vacuum chamber 105. A vacuum may be provided in the vacuum chamber. For example, the material deposition apparatus may include a vacuum pump for providing the vacuum in the vacuum chamber.

The term "vacuum" as used herein can be understood in the sense of a technical vacuum having a vacuum pressure of less than, for example, 10 mbar. Typically, the pressure in a vacuum chamber as described herein may be between $10^{-4}$ mbar and about $10^{-8}$ mbar, more typically between $10^{-4}$ mbar and $10^{-7}$ mbar, and even more typically between about $10^{-5}$ mbar and about $10^{-6}$ mbar. In some embodiments, the total pressure in the one or more vacuum chambers may range from about $10^{-4}$ mbar to about $10^{-7}$ mbar. Accordingly, the vacuum chamber can be a "vacuum deposition chamber", i.e. a vacuum chamber configured for vacuum deposition.

According to embodiments that can be combined with any other embodiment described herein, the material deposition apparatus may include an evaporation source assembly.

The term "evaporation source assembly" as used throughout the present disclosure may be understood as an assembly, unit or apparatus that includes one or more evaporation sources. As such, the features discussed herein with respect to the evaporation source assembly may also correspondingly apply to a single evaporation source. For example, only one evaporation source may be included in the evaporation source assembly. In such instances, the evaporation source assembly may be referred to as the evaporation source. According to some embodiments, which may be combined with other embodiments described herein, two or more evaporation sources can be provided in the evaporation source assembly.

The evaporation source assembly is configured to provide evaporated material towards a substrate 122. The evaporation source assembly can be provided in the vacuum chamber 105 or can at least partially be provided in the vacuum chamber 105. The evaporation source assembly may be disposed along the substrate transportation direction (D) for providing material to the substrate.

However, as will be discussed in greater detail with respect to FIG. 2A, the evaporation source assembly may also include two or more evaporation sources. For example, the evaporation source assembly may include a first evaporation source having a first deposition area for depositing material onto the substrate and a second evaporation source having a second deposition area for depositing material onto the substrate. Each of the two or more evaporation sources may be an evaporation source 110 as exemplarily shown in FIG. 1. According to embodiments that can be combined with any other embodiment described herein, the material deposition apparatus may include a substrate transportation device 120. The substrate transportation device may be configured to transport the substrate 122. The substrate 122 may be arranged around the substrate transportation device 120. The substrate transportation device 120 may be a coating drum as exemplarily shown in FIG. 1. The coating drum may include a curved drum surface, and the substrate transportation device may be configured to move the substrate 122 on the curved drum surface past the evaporation source 110 in a circumferential direction or substrate transport direction D.

For example, the substrate may be a flexible web or foil, and the material deposition apparatus may be a roll-to-roll deposition apparatus. The coating drum may be a cylinder extending in a length direction perpendicular to the paper plane of FIG. 1. The substrate transportation device may be movable, i.e. the coating drum may be rotated around axis A. The substrate transportation device may be moved or rotated clockwise or counterclockwise. The substrate transportation device may change direction during deposition, e.g. when the substrate transportation device is rotated clockwise during deposition, the rotational direction may be changed to counterclockwise and vice versa.

According to some embodiments, which can be combined with other embodiments described herein, the coating drum may be a gas cushion coating drum. The gas cushion coating drum provides a cooling gas between the surface of the drum and the substrate. For example, the drum and the cooling gas can be cooled to temperatures below room temperature. Heat can be removed from the substrate to allow for higher deposition rates without damaging the thin foil or web on which the material is deposited.

For a gas cushion roller, a first subgroup of gas outlets, i.e., the open gas outlets, can be provided in a web guiding region of the processing drum. A second subgroup of gas outlets, i.e., closed gas outlets, are provided outside the web guiding region. Since gas is only emitted in the web guiding region where it is needed to form the hover cushion, no or little gas is directly emitted into a region not overlapped by the web, waste of gas may be reduced and/or a better vacuum may be maintained at lesser strain on the pump system.

According to some embodiments, which can be combined with other embodiments described herein, additionally or alternatively to the subgroups of gas outlets, the outer surface of the processing drum may be coated with a microporous surface. The microporous surface may allow for a small amount of cooling gas to flow from inside the processing drum to the surface of the processing drum. The cooling gas may form a gas cushion between the processing drum and the web or foil guided over the processing drum for material deposition thereon.

According to embodiments that can be combined with any other embodiment described herein, the substrate can be a thin substrate, e.g. a foil or web. The substrate to be coated may have a thickness of 50 µm or less, particularly 20 µm or less, or even 10 µm or less. For example, a metal foil or a flexible metal-coated foil may be coated in the vapor deposition apparatus. In some implementations, the substrate 10 is a thin copper foil or a thin aluminum foil having a thickness below 30 µm, e.g. 10 µm or less.

The thickness of the substrate results in that the substrate will face sudden temperature changes, i.e. the substrate will heat up quickly by which the substrate expands and also cool down quickly by which the substrate contracts. Such sudden temperature changes result in tensions, stresses and stretching causing damage and/or wrinkles in the substrate. The temperature profile or distribution provided by embodiments described herein and their effects on the substrate will be discussed with respect to FIG. 2B.

According to embodiments that can be combined with any other embodiment described herein, the material deposition apparatus may include a substrate provision or unwinding roll (not shown in FIG. 1) for providing an unprocessed substrate. The substrate provision or unwinding roll may be moved i.e. rotated such that the substrate may be unrolled from the substrate provision or unwinding roll. Additionally, the material deposition apparatus may include a substrate receiving roll for taking up the processed substrate after deposition of material onto the substrate has taken place. The substrate receiving roll may be moved, i.e. the substrate receiving roll may be rotated for taking up the processed substrate. The substrate receiving roll and the substrate provision or unwinding roll may be rotated in the same direction, i.e. both rolls may be rotated clockwise or the substrate provision or unwinding roll may be rotated in opposing directions, i.e. one roll may be rotated clockwise and the other roll may be rotated counterclockwise or vice versa.

It is to be understood that the substrate transportation device can also be a roll-to-roll transportation device although not shown in FIG. 1. The roll-to-roll transportation device may include an unwinding or substrate provision roll from which the unprocessed substrate may be provided. The roll-to-roll transportation device may further include a receiving roll for rolling up the processed substrate. The unwinding or substrate provision roll and the receiving roll may be each provided in different vacuum chambers compared to the evaporation source assembly or may be provided in the same vacuum chamber as the evaporation source assembly. Between the unwinding roll and the receiving roll, the substrate may be provided in the vicinity of the evaporation source assembly for depositing material onto the substrate. For example, the substrate may be "spanned" between the unwinding roll and the receiving roll and may be guided above the evaporation source assembly for receiving the evaporated material. For example, the substrate may be provided with defined and/or controlled forces. A substrate tensioner may be provided.

According to embodiments that can be combined with any other embodiment described herein, an evaporation source or an evaporation source assembly may have a first end and a second end opposite the first end. The first end and the second end may define a space in between. The term "a second end opposite the first end" as used throughout the present disclosure may be understood as two sides of the evaporation source or the evaporation source assembly being arranged opposite each other. For example, the evaporation source may include a first wall and a second wall, which may, for example, extend substantially in the same direction, particularly for one evaporation source and being arranged opposite each other. The first end and the second end may be understood as the side wall limitations of the evaporation source or the evaporation source assembly. In particular, the first end and the second end may define a surface 119 in between, i.e. a surface that may be substantially perpendicular to the first wall and the second wall of the evaporation source. The surface of the evaporation source may be aligned with the substrate transportation device, i.e. the surface 119 of the evaporation source may be oriented such that a provision of material to be deposited may be enhanced. The surfaces of different evaporation sources in an evaporation source assembly may be inclined with respect to each other (similar to the first end and the second end), wherein the inclination corresponds to the curvature of the coating drum.

According to embodiments that can be combined with any other embodiment described herein, the evaporation source assembly may provide material to be deposited to the substrate. The evaporation source assembly may include one or more crucibles where the material to be deposited may be evaporated by providing a temperature to the material suitable to evaporate the material. For example, the material to be deposited can include, for example, metal, in particular lithium, metal alloys, and other vaporizable materials or the like which have a gaseous phase under given conditions. According to yet further embodiments, additionally or alternatively, the material may include magnesium (Mg), ytterbium (Yb) and lithium fluoride (LiF).

Further, an evaporation source of the evaporation source assembly may include a distributor. The distributor may distribute the evaporated material. The material may be provided in the distributor, for example, by the crucible being connected to the distributor via an inlet opening. The distributor may have one or more openings. Evaporated material to be deposited can exit the distributor through the openings. The source material can be deposited on the substrate 122 by a plurality of nozzles extending through the openings. In other words, the evaporation source may include one or more nozzles for providing evaporated material to the substrate. The material to be deposited may e.g. be sprayed to the substrate by the plurality of nozzles.

According to embodiments that can be combined with any other embodiment described herein, the material deposition apparatus of FIG. 1 includes at least a first heating assembly 150. The first heating assembly may be disposed along the substrate transportation direction.

The term "heating assembly" as used throughout the present disclosure may be understood as an assembly, unit or apparatus that may include one or more heating elements. For example, the heating assembly may include at least one heating element or may include two or even more heating elements.

The "heating element" as used throughout the present disclosure may be a graphite heater. Graphite heaters are advantageous since they provide high operating temperatures of, e.g., temperatures in the range of 500° C. to 1800° C. or even above and a high emissivity of, e.g., range of 0.8 to 0.9 or above which allows to realize a high-power density on the substrate. The heating element may also include radiation shields in order to concentrate the power in the direction to the substrate.

The heating assembly may have a first end and a second end opposite the first end. The first end and the second end may define a space in between. The term "a second end opposite the first end" as used throughout the present disclosure may be understood as two sides of the heating assembly being arranged next to each other. For example, the heating assembly may include a first wall and a second wall opposite each other. The first end and the second end may be understood as the side wall limitations of the heating assembly.

The first heating assembly 150 as shown in FIG. 1 includes two heating elements namely a first heating element 152 and a second heating element 154. The heating elements may be arranged next to each other, e.g. sequentially within the heating assembly. The first heating assembly is configured to provide a first heating area for the substrate.

The term "heating area" as used throughout the present disclosure may be understood as an area for the substrate in which the substrate is exposed to a temperature that is higher than the substrate temperature, i.e. an area in which the substrate is heated. The heating area may be defined between two points in the substrate transportation direction, e.g. a starting point, at which heating of the substrate begins and an end point, at which heating of the substrate ends. The heating area may be provided in order to increase the temperature of the substrate.

Between the starting point and the end point of the heating area, the heating area may include one or more heating zones having one or more temperatures. For example, the heating area may be divided or partitioned in different heating zones, wherein each heating zone may have a different temperature. Each of the one or more heating zones may be provided by an individual heating element included in the heating assembly such that, for example, a first heating element provides a first heating zone A and a second heating element provides a second heating zone B. As such, the term "heating area" may also be understood as the sum of each of the one or more individual heating zones provided by the one or more heating elements included in the heating assembly.

The heating area may be formed by only a single heating zone or may be formed by two or more heating zones. In the case of only one heating zone, the heating area may correspond to the one heating zone. In the case of more than one heating zone, each heating zone may have a different temperature. Alternatively, each heating zone provided may also have the same temperature. The heating zones may be provided one after another, i.e. adjacent to another or sequentially in order to define or span the entire heating area, i.e. between the starting point of the heating area and the end point of the heating area. The two or more heating zones may be also (partially) overlapping. Each of the one or more heating zones may be regarded as smaller portions or regions of the heating area.

As shown in FIG. 1, for example, the substrate may be transported in the substrate transportation direction D (e.g. from right to left along the substrate transportation direction D in FIG. 1) to pass the first heating zone A of the first heating area before being transported to pass the second heating zone B of the first heating area. In other words, the substrate will encounter the first heating zone A spatially before the second heating zone B. The transition between the first and the second heating zone may be seamless, e.g. when the heating zones are (partially) overlapping.

In the case of another heating zone being provided, the substrate may be further transported to pass a third heating zone provided by a third heating element (not shown in FIG. 1) of the first heating area after the second heating zone. Enabling the substrate to pass the one or more heating zones sequentially, e.g. one after another, allows to gradually increase the temperature of the substrate by exposing the same to different temperatures. For example, the first temperature of the first heating zone may be lower than the second temperature of the second heating zone.

In the example of FIG. 1, the first heating assembly 150 is configured to provide a first heating area for heating the substrate 122. The first heating area may be located directly adjacent to the deposition area of the evaporation source assembly. In the example of FIG. 1, the first heating assembly is located on the right side of the evaporation source assembly. The first heating assembly in the example of FIG. 1 includes a first heating element 152 that is configured to provide a first heating zone A having a first temperature and a second heating element 154 that is configured to provide a second heating zone B having a second temperature. The first heating zone is provided in the substrate transportation direction (D) spatially before the second heating zone such that the substrate will be transported to pass the first heating zone before passing the second heating zone The first heating element and the second heating element may be individually controllable in that the first temperature of the first heating zone and the second temperature of the second heating zone are individually adjustable.

For example, the first heating element may be controlled to provide the first temperature while, e.g. individually and independently therefrom, the second heating element may be controlled to provide the second temperature, wherein the first temperature may be different from the second temperature. Alternatively, the first temperature may be controlled to be the same as the second temperature. In such instances, the first heating zone might be regarded as being enlarged by the second heating zone, e.g. be spatially longer for the substrate in the substrate transportation direction, since the temperatures are the same. In such instances, the substrate exposure to such a temperature will be longer.

Providing a first and a second heating zone having different temperatures may allow the substrate temperature to receive a seamless temperature transition between the first heating zone and the second heating zone, particularly between the first temperature and the second temperature. That way the temperature of the substrate may be smoothly, uniformly, slowly or gradually increased before being transported to (e.g., before entering) the deposition area and/or after being transported out of (e.g., after exiting) the deposition area of the evaporation source assembly.

For example, before entering the first heating area of the first heating assembly, the substrate may have an initial substrate temperature of e.g. 20° C. (room temperature (RT)) or below in the case of active cooling in the range of RT to −20° C. or below. The temperature the substrate may have upon entering the deposition area (and upon starting of material deposition thereon) may be, e.g., 70° C. to 160° C.

After being transported through the first heating zone, the substrate may have a temperature of e.g. 30° C. to 50° C. Then, the substrate may be transported further to pass the second heating zone, having a second temperature of e.g. 70° C. to 120° C. Upon entering the second heating zone, the substrate will be exposed to the second temperature resulting in a second heating of the substrate.

Since the temperature difference between the substrate temperature and the first temperature at the first heating zone is less that the difference between the substrate temperature and the second temperature at the second heating zone, the temperature transition of the substrate will be smooth or seamless, i.e. sudden temperature changes are avoided. Thus, the temperature of the substrate may be increased gradually, sequentially or progressively by which the formation of wrinkles is avoided, minimized, or at least reduced.

As shown in FIG. 1, the first heating area is located directly adjacent to the deposition area of the evaporation source assembly.

The term "directly adjacent" as used throughout the present disclosure may be understood in that the heating area of the heating assembly is located directly next to the deposition area of the evaporation source assembly. In the substrate transportation direction this includes the space or the area located spatially before the deposition area as well as the space or the area located spatially after the deposition area.

The term "transition area" as used throughout the present disclosure may be understood as the space or the area between the deposition area and a heating area.

In the substrate transportation direction D, that is, the area after the substrate leaves the first heating area and before entering the deposition area as well as the area after the substrate leaves the deposition area and before entering the second heating area. The transition area 170 is located spatially before or after the deposition area. Within the transition area, the substrate may neither receive material deposition thereon nor exposure to heat. As mentioned above, the heating area is directly adjacent to the heating area, i.e. the transition area can have minimal or small distance or length in order to prevent the substrate from cooling. For example, when the transition area is longer than or equal to 1 cm, the substrate may have lost the temperature provided by a heating area. According to some embodiments, which can be combined with other embodiments described herein, the transition area can be 1 cm or smaller, creating a seamless temperature transition between the heating area and the deposition area.

In case the heating area is located spatially before the deposition area, the transition area for the substrate can be minimal, such that the temperature of the substrate before entering the deposition area is at least 50% of the temperature provided after the heating area as a study state temperature in the coating zone. 50% or less, such as 20% or less, of the temperature is lost in the transition area by providing the heating area directly adjacent to the deposition area.

In case a heating area is located spatially after the deposition area, the transition area for the substrate can be minimal, such that the temperature the substrate has before entering the heating area is at least 50% of the temperature after exiting the deposition area. 50% or less, such as 20% or less, of the temperature is lost in the transition area by providing the heating area directly adjacent to the deposition area.

In particular, the transition area between the heating area and the deposition area may be e.g. less than 1 cm, particularly less than 0.5 cm in order for the heating area and the deposition area to be directly adjacent.

Further, the evaporation source assembly may include at least one temperature-controlled shield 112. The temperature-controlled shield may be provided at the evaporation source or the evaporation source assembly. In particular, one or more temperature-controlled shields may be provided at the evaporation source. The temperature-controlled shield 112 may be heatable, such that vapor condensation on the temperature-controlled shield 112 can be reduced or prevented when the temperature-controlled shield 112 is heated to an operation temperature, e.g. an operation temperature of 500° C. or more in some embodiments.

According to embodiments of the present disclosure, the temperature-controlled shield has a width along the transport direction which is at least 10% larger, particularly at least 20% larger than the corresponding width of the evaporation source. Accordingly, material deposition is not limited to an area of the evaporation source in the transport direction. Limiting the plume of material to an area of the evaporation source may result in a sudden increase in temperature of the substrate, which may result in wrinkles and warping of the substrate, e.g. a thin foil or web. Accordingly, the plume of material from the evaporation source is allowed to spread towards the sides of the evaporation zone for having a pre-heating zone and/or a post-cooling zone. As the temperature increase is directly correlated to the amount of material deposited, the extended shape of the heated shield results in a low deposition rate at the entrance. The deposition rate increases, for example, continuously increases up to a maximum deposition rate at the main body of the evaporation source. As described herein, the heat load is mainly provided by the condensation energy. Accordingly, the temperature profile of the web or foil is proportional to the deposition rate. Accordingly, the temperature profile increases similarly to the above described profile of the deposition rate.

According to embodiments that can be combined with any other embodiment described herein, the temperature-controlled shield may include a heat-conducting material. The temperature-controlled shield may include a material suitable for contact heating or cooling. For example, the temperature-controlled shield may be made of a metal material, e.g. of stainless steel, Mo, Ta, W, Invar or other high temperature materials or high temperature metals. For example, also AlN may be provided as good heat conduction ceramic.

According to embodiments that can be combined with any other embodiment described herein, the one or more temperature-controlled shields may be provided at the first and second end of the evaporation source or evaporation source assembly. In particular, a first temperature-controlled shield may be provided at the first end of the evaporation source and a second temperature-controlled shield may be provided at the second end of the evaporation source assembly. Alternatively, the first and the second temperature-controlled shield may be provided as a single structure that provides shielding on the first end of the evaporation source assembly and the second end of the evaporation source assembly. As such, at least one temperature-controlled shield may be used. Additionally or alternatively, a first portion of the temperature-controlled shield may be provided at the first end of the evaporation source assembly and a second portion of the temperature-controlled shield may be provided at the second end of the evaporation source assembly. As before, the terms "evaporation source assembly" and "evaporation source" may be used interchangeably when only one evaporation source is provided, i.e. such as in the example of FIG. 1.

The temperature-controlled shield 112 does not contact the substrate transportation device 120, such that the substrate supported on the substrate transportation device 120 can move past the evaporation source 110 and past the temperature-controlled shield 112 during material deposition. The temperature-controlled shield 112 may only leave a small gap between the temperature-controlled shield 112 and the substrate transportation device 120, e.g. a gap of 5 mm or less, 3 mm or less, 2 mm or less, or even about 1 mm, such that hardly any vapor can propagate past the temperature-controlled shield, e.g. in a lateral direction.

According to embodiments that can be combined with any other embodiment described herein, the temperature-controlled shield may extend along the circumferential direction or substrate transportation direction D. The temperature-controlled shield may include a width dimension along the axis of the substrate transportation device 120 and a length dimension in a direction different from the axis of the substrate transportation device 120 i.e. in the circumferential direction or substrate transportation direction D.

According to embodiments that can be combined with any other embodiment described herein, the temperature-controlled shield may extend outwardly from the evaporation source assembly, particularly radially or laterally away from the evaporation source assembly. In the following, such a temperature-controlled shield may also be referred to as an "elongated shield". For example, the temperature-controlled shield may include a straight portion 113 extending radially away or outwardly from the evaporation source. The temperature-controlled shield or the straight portion may be directed from the evaporation source towards the substrate 122. The at least one temperature-controlled shield or the straight portion 113 may delimit a deposition area towards the substrate.

The temperature-controlled shield 112 may be bent or may include a bent portion or bent end 111. The bent portion may be bent with respect to the straight portion 113. The bent end 111 may further delimit a deposition area between the evaporation source and the substrate. The bent portion or bent end may be tilted towards the substrate, i.e. the bent end may be closer to the substrate compared to the straight portion. In other words, the straight portion may have a greater distance to the substrate than the bent end.

The material deposition apparatus may include a deposition area between the evaporation source 110 and the substrate transportation device 120. The deposition area may be understood as an area where the material to be deposited is provided to the substrate. The deposition area can be filled with the material to be deposited from the evaporation source and may be limited sidewise by the one or more temperature-controlled shields, for example, to provide for a uniform material deposition. For example, the at least one temperature-controlled shield may delimit the deposition area of an evaporation source between a starting point of the deposition area where material deposition onto the substrate begins and an end point of the deposition area where material deposition onto the substrate ends. In other words, the at least one temperature-controlled shield defines the boundaries of the deposition area between the starting point and the end point in which material deposition onto the substrate occurs.

In the example of FIG. 1, the first heating assembly is disposed along the substrate transportation direction (D) such that the first heating area provided by the first heating assembly is located directly adjacent to the deposition area of the evaporation source assembly. In FIG. 1, the heating area is directly adjacent to the right side of the deposition area.

In particular, the first heating area may be located directly adjacent to the starting point of the deposition area defined by the at least one temperature-controlled shield such that the substrate directly enters the deposition area at the starting point when exiting the first heating area. The term "directly entering" may be understood in that a seamless transition is provided for the substrate between the first heating area and the deposition area, i.e. between the first heating area and the starting point at which material deposition onto the substrate occurs. "Seamless transition" may be understood in that the substrate is transported such that sudden temperature changes for the substrate are avoided, i.e. that the substrate does not substantially cool down between the deposition area and the first heating area.

The one or more temperature-controlled shields may be elongated compared to conventional shields in the art. In particular, the straight portion 113 may be elongated. An elongated temperature-controlled shield may be understood as a shield that covers or encloses a large surface area of the substrate, thereby providing a larger deposition area compared to short shields or side walls in the art, for example a shield extended at an angle of 90° from the deposition source towards the substrate. Accordingly, the one or more temperature-controlled shields may be arranged at at least one of the first end or the second end of the evaporation source assembly and may extend outwardly towards the substrate transportation device and may be configured to enlarge the deposition area, particularly as compared to a straight shield extending at an angle of 90° towards the substrate.

The first heating assembly as shown in the example of FIG. 1 may be configured for pre-heating the substrate or for post-heating the substrate.

The term "pre-heating" may be understood as a heating of the substrate in the direction of the substrate transportation direction (D) (spatially) before the starting point of the deposition area of the evaporation source assembly. The term "post-heating" may be understood as a heating of the substrate in the direction of the substrate transportation direction (D) (spatially) after the end point of the deposition area of the evaporation source assembly. As mentioned above, pre-heating and/or post heating may be carried out in one or more heating assemblies.

As shown in the example of FIG. 1, the material deposition apparatus includes a second heating assembly 160 disposed along the substrate transportation direction (D). The second heating assembly is configured to provide a second heating area for heating the substrate. In general, the second heating assembly is constructed in the same way as the first heating assembly and the second heating area may be formed or provided in the same way as the first heating area. Details, features, and embodiments described with respect to the first heating assembly can be similarly provided for the second heating assembly.

The first heating assembly and the second heating assembly can be disposed on opposite sides of the evaporation source assembly. Similar to the first heating assembly, the second heating assembly may be located directly adjacent the deposition area of the evaporation source assembly, for example, opposite the first heating assembly or on the opposite side of the first heating assembly. The evaporation source assembly in FIG. 1 can be disposed along the substrate transportation direction (D) between the first heating assembly and the second heating assembly such that the first heating area is directly adjacent to the deposition area (as shown in FIG. 1 on the right side of the deposition area) and such that the second heating area is directly adjacent to the deposition area opposite the first heating area (as shown in FIG. 1 on the left side of the deposition area).

As shown in FIG. 1, the second heating assembly is located directly adjacent to the endpoint of the deposition area defined by the at least one temperature-controlled shield such that the substrate directly enters the second heating area when exiting the deposition area of the evaporation source assembly.

As shown in the example of FIG. 1, the second heating assembly is configured for post-heating the substrate, i.e. for providing a heating area after the substrate exits the deposition area of the evaporation source assembly. The second heating assembly provides the second heating area for the substrate in the direction of the substrate transportation direction (D) (spatially) after the deposition area of the evaporation source assembly. The second heating area may be regarded as a post-heating area for the substrate for post-heating the substrate after the substrate exists at the endpoint of the deposition area of the evaporation source assembly. The second heating assembly may reduce a sudden temperature drop after the deposition area. The temperature of the substrate may be smoothly, uniformly, slowly or gradually decreased after material is deposited onto the substrate.

Figure 2A:
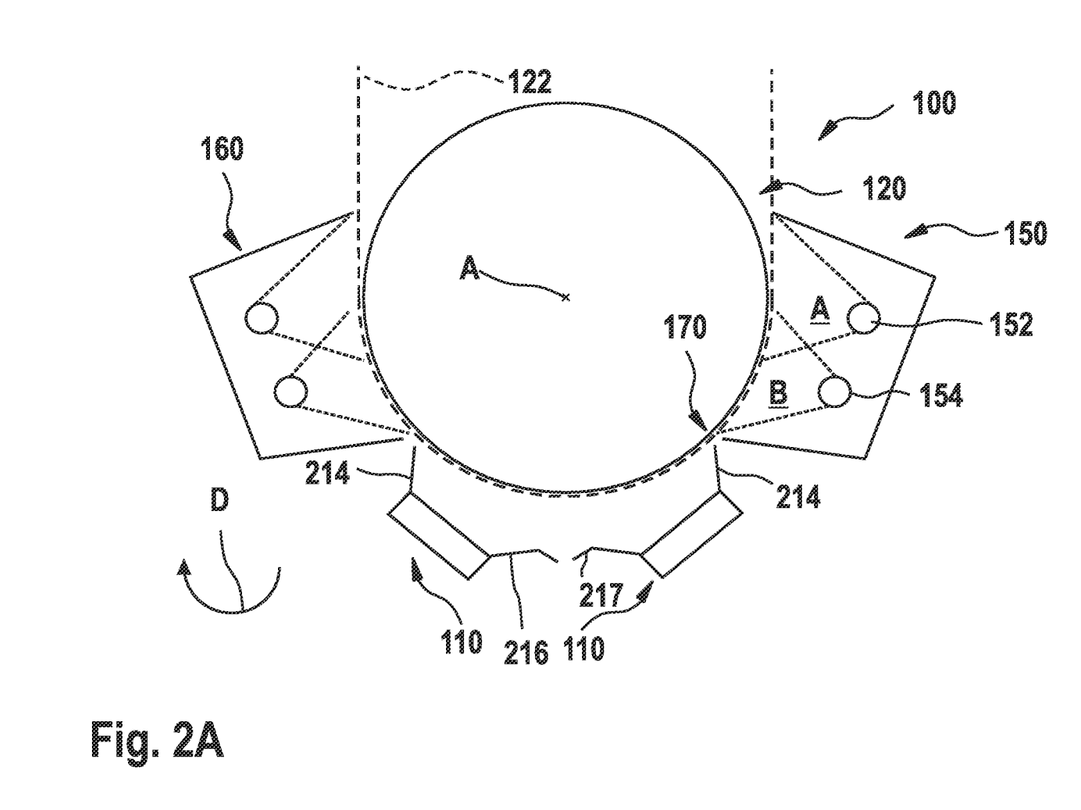
FIG. 2A shows a schematic view of a material deposition apparatus according to embodiments described herein.

According to embodiments that can be combined with any other embodiment described herein and with exemplary reference to FIG. 2A, the material deposition apparatus 200 may include an evaporation source assembly that may include at least two evaporation sources. The at least two evaporation sources may be lined up with respect to a substrate transportation direction indicated as arrow D in FIG. 2A. The at least two evaporation sources may be provided in a row, for example, sequentially next to or behind each other, with respect to the substrate transportation direction D. The at least two evaporation sources may be evaporation sources as described herein, e.g. as described in the example of FIG. 1.

For example, the evaporation source assembly may include a first evaporation source 110 having a first deposition area for depositing material onto the substrate and a second evaporation source 110 having a second deposition area for depositing material onto the substrate.

The at least two evaporation sources 110, i.e. the first and the second evaporation source, may each include at least one temperature-controlled shield delimiting the first and the second deposition area between a starting point and an endpoint. Also, the first and the second evaporation source each may include two asymmetric temperature-controlled shields or may have an asymmetric temperature-controlled shield with two portions being asymmetric with respect to each other. The term "asymmetric" as used herein may be understood in that the two temperature-controlled shields or the portions of a temperature-controlled shield may be different in shape and size. Further, it may be understood that the two asymmetric shields or the two portions may have different lengths and that the two asymmetric shields or the two portions may extend in different directions while both extending towards the substrate. The asymmetric temperature-controlled shield may include a first asymmetric temperature-controlled shield 214 and a second asymmetric temperature-controlled shield 216 being arranged at opposite sides of each of the at least two evaporation sources. The first asymmetric temperature-controlled shield 214 may be a straight shield, i.e. the first temperature-controlled shield may not include a bent end. The first asymmetric temperature-controlled shields 214 may extend outwards from each of the evaporation sources i.e. the first asymmetric temperature-controlled shields 214 may be arranged at the first end of one of the at least two evaporation sources and at the second end of the other of the at least two evaporation sources or vice versa and the one and the other evaporation sources may be arranged next to each other.

The second asymmetric temperature-controlled shield 216 may include a straight portion and a bent end. The bent end may be bent away from the substrate or towards the other shield. A deposition area between the second asymmetric temperature-controlled shields 216 of adjacent evaporation sources is provided. The second asymmetric temperature-controlled shield 216 may extend inwards from each of the evaporation sources i.e. the second asymmetric temperature-controlled shields 216 may be arranged at the second end of one of the at least two evaporation sources and at the first end of the other of the at least two evaporation sources or vice versa and may extend towards each other. In particular, the bent ends may be bent towards each other i.e. the respective straight portions may be directed towards the substrate and the respective bent ends may optionally be directed away from the substrate. For example, the bent end may be bent by an angle with respect to the straight portion of the second asymmetric temperature-controlled shield.

In the example of FIG. 2A, each of the first deposition area of the first evaporation source and the second deposition area of the second evaporation source may be delimited by the first asymmetric temperature-controlled shield 214 and the second asymmetric temperature-controlled shield 216 being arranged at opposite sides of each of the first and the second evaporation source.

Advantageously, such an open shield design as described above between at least two evaporation sources allows for vacuum pumping but may prevent stray coating of the material to be deposited. Further advantageously, the asymmetric shield arrangement, in particular the arrangement of two second asymmetric temperature-controlled shields as described above, prevents excessive cooling down of the substrate between the two evaporation sources where no active particle deposition takes place. Thus, the temperature brought into the material deposition apparatus by the evaporated material can be distributed more evenly, also between two evaporation sources, such that wrinkles in the substrate which can be e.g. a foil can effectively be prevented or avoided. In other words, the interface between two evaporation sources where normally the substrate would be cooled down since no or less material particles are present, can be bridged to allow for a uniform coating without damaging the substrate, caused by a fast temperature change between two evaporation sources.

It is to be understood that the evaporation source assembly may be also formed by more than two evaporation sources that may be lined up along the substrate transportation direction and that between each of the evaporation sources an open shield design, i.e. an asymmetric shield design with two bent shields facing each other, may be provided. When two evaporation sources are lined up, an enlarged deposition area may be provided in that the asymmetric temperature-controlled shield 214 may define a starting point of the first deposition area of the first evaporation source and the asymmetric temperature-controlled shield 214 of the second evaporation source may define an end point of the second deposition area of the second evaporation source. The first heating area may be located directly adjacent to the starting point of the first deposition area of the first evaporation source (e.g. on the right as shown in FIG. 2A) and the second heating area may be located directly adjacent to the end point of the second deposition area of the second evaporation source (e.g. on the left as shown in FIG. 2A). The first heating area and the second heating area can be provided on opposite sides of the evaporation source assembly, including the first evaporation source and the second evaporation source.

As mentioned, the material deposition apparatus in the example of FIG. 2A includes a first heating assembly and a second heating assembly. The first heating assembly and the second heating assembly may be provided on opposite sides of the evaporation source assembly. According to some embodiments, which can be combined with other embodiments described herein, additionally or alternatively a heating assembly may also be provided between the first evaporation source and the second evaporation source, e.g. to reduce a transition area between the first deposition area and the second evaporation source without heat load on the substrate.

That is, the first heating assembly and the second heating assembly may be provided on opposite sides of the first evaporation source such that the first heating area provided by the first heating assembly is directly adjacent to the deposition area of the first evaporation source, such that the substrate will be transported to pass the first heating area before entering the deposition area of the first evaporation source, i.e. the first heating area may be a pre-heating area for the substrate. A further heating assembly may be provided opposite the first heating assembly such that the second heating area provided by the second heating assembly is directly adjacent to the deposition area of the first evaporation source, such that the substrate will be transported to pass the second heating area after exiting the deposition area of the first evaporation source, i.e. the second heating area may be a post-heating area for the substrate.

The second heating assembly may be provided opposite the further heating assembly such that the second heating area provided by the second heating assembly is directly adjacent to the deposition area of the second evaporation source, such that the substrate will be transported to pass the second heating area after exiting the deposition area of the second evaporation source, i.e. the second heating area may be a post-heating area for the substrate.

Figure 2B:
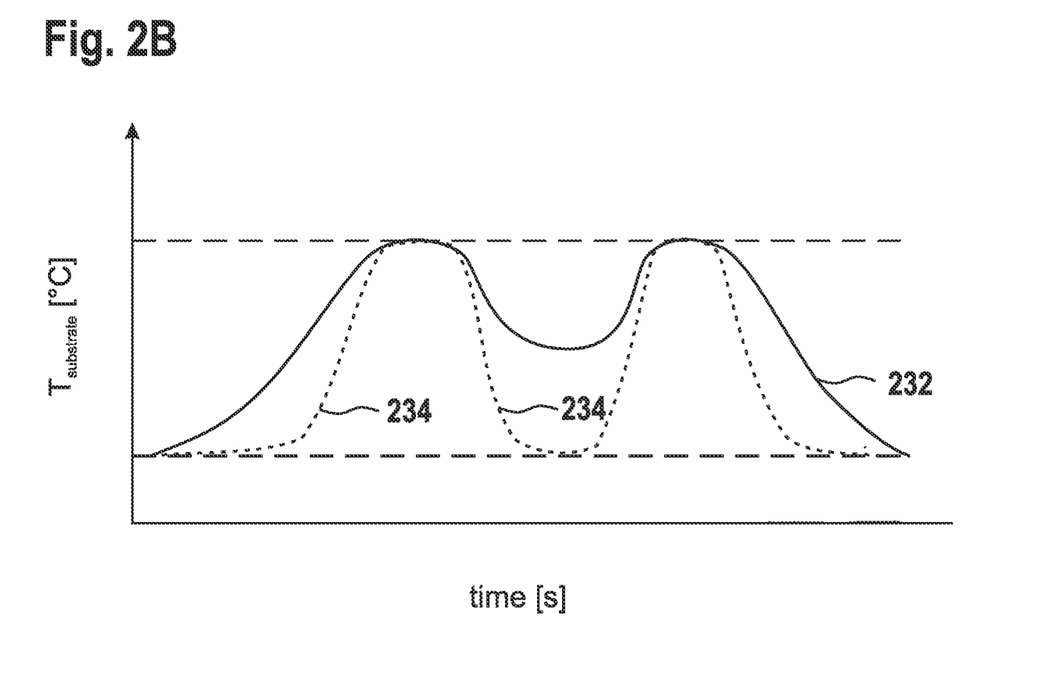
FIG. 2B shows a temperature profile at a substrate according to embodiments described herein.

The beneficial effect of providing a first and a second heating assembly (or even more) for pre-heating and post-heating the substrate may be exemplarily seen in the diagram of FIG. 2B. FIG. 2B shows two temperature profiles where the x-axis is the time in seconds and the y-axis is the temperature at the substrate in ° C. The line 234 shows a temperature profile of a material deposition apparatus having an evaporation source assembly including two evaporation sources lined up in the substrate transportation direction without heating assemblies being provided on opposite sides of the evaporation source assembly for pre-heating the substrate and for post-heating the substrate and without the temperature-controlled shield between the evaporation sources being "open" between the sources. The solid line 232 shows a temperature profile of two evaporation sources lined up in the substrate transportation direction with two heating assemblies provided on opposite sides of the evaporation source assembly directly adjacent to the deposition area of the evaporation source assembly. Accordingly, before reaching the first plateau, the substrate may be regarded as being spatially at the first heating area i.e. on the right side of the right evaporation source shown in FIG. 2A. Due to the low mass of the substrate, the temperature at the substrate increases in a volatile way when no heating area is provided directly adjacent to the deposition area of the evaporation source assembly before the substrate enters the deposition area and directly adjacent to the deposition area of the evaporation source assembly after the deposition area. The temperature may drop very fast when the substrate enters the deposition area and after the substrate has passed the deposition area of the evaporation source assembly.

In comparison, for the evaporation source assembly having a first heating assembly and a second heating assembly provided on opposite sides directly adjacent to the deposition area, the temperature of the substrate slowly, gradually or progressively increases and/or remains at a moderate level. A seamless temperature transition for the substrate is provided before entering the deposition area and after exiting the deposition area of the evaporation source assembly, particularly within the transition area mentioned above.

Accordingly, the temperature at the substrate can be maintained more constantly and at a moderate level. Therefore, heat-related damage to the substrate can be avoided or prevented. Further, the temperature change in time can be reduced which reduces or prevents wrinkles or warpage of the substrate.

Figure 3:
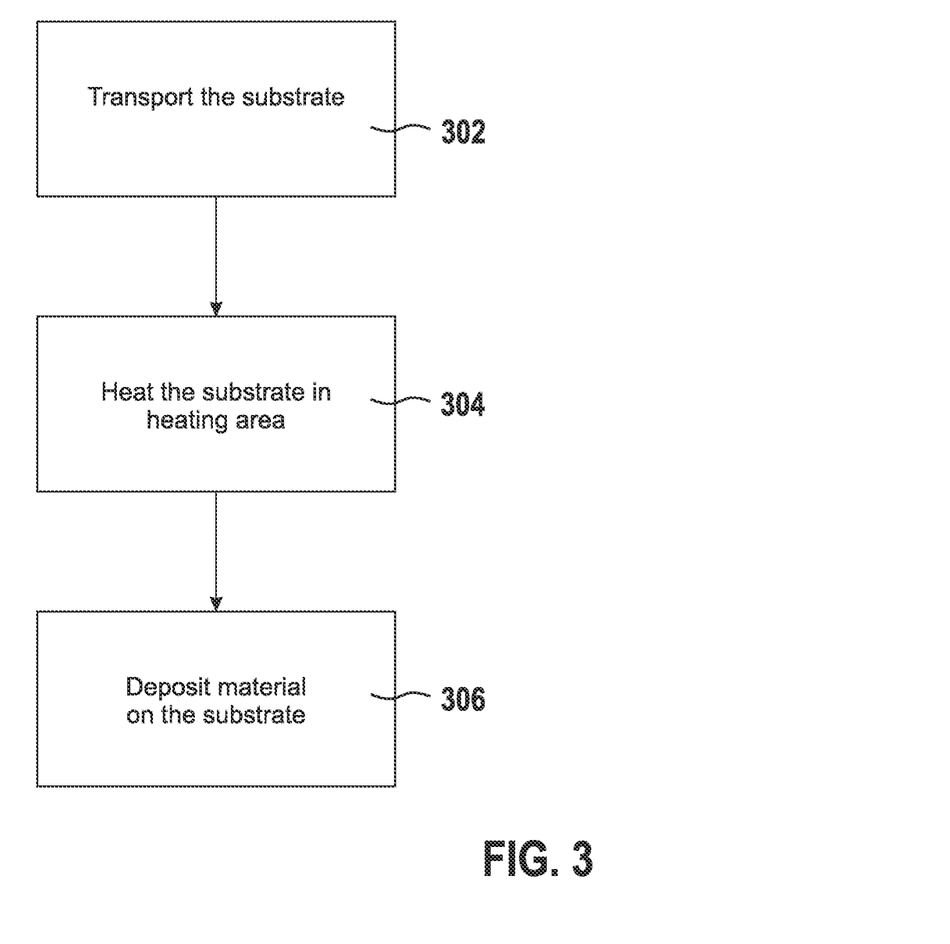
FIG. 3 shows a flow diagram of a method according to embodiments described herein.

According to embodiments that can be combined with any other embodiment described herein, a method for depositing a material onto a substrate is provided. At operation 302, the substrate is transported on a substrate transportation device along a substrate transportation direction D, the substrate having a first temperature. For example, the initial substrate temperature may be in the range of RT or below, such as down to −20° C. or even below. At operation 304, the substrate is heated to a second temperature at a first heating area of at least a first heating assembly. The second temperature may be in the range of 70-160° C. The first heating area may be located directly adjacent to a deposition area of an evaporation source assembly. At operation 306, material is deposited onto the substrate at the deposition area of an evaporation source assembly. Heating of the substrate to the second temperature may include individually controlling a first heating element of the first heating assembly to provide a first heating zone having a first temperature, individually controlling a second heating element of the first heating assembly to provide a second heating zone having a second temperature, wherein the first temperature differs from the second temperature and gradually heats the substrate to the second temperature by sequentially applying the first temperature and the second temperature to the substrate.

The method may further include having the first heating area directly adjacent to the deposition area of the evaporation source assembly such that the substrate directly enters the deposition area when exiting the first heating area.

The method may further include maintaining a temperature of the substrate between the first heating area and the deposition area of at least 50% of the first temperature or the second temperature.

The method may further include heating the substrate to a third temperature at a second heating area of a second heating assembly, the second heating area being located directly adjacent to the deposition area of the evaporation source assembly opposite the first heating area.

Heating the substrate to the third temperature may include individually controlling a first heating element of the second heating assembly to provide a first heating zone having a first temperature, individually controlling a second heating element of the second heating assembly to provide a second heating zone having a second temperature, wherein the first temperature differs from the second temperature, and gradually heating the substrate to the third temperature by sequentially applying the first temperature and the second temperature to the substrate.

Also, the method may include having the second heating area directly adjacent to the deposition area of the evaporation source assembly such that the substrate directly enters the second heating area when exiting the deposition area. The method may further include maintaining a temperature of the substrate between the deposition area and the second heating are of at least 50% of the first temperature or the second temperature.

While the foregoing is directed to embodiments of the disclosure, other and further embodiments of the disclosure may be devised without departing from the basic scope thereof, and the scope thereof is determined by the claims that follow.

The invention claimed is:

1. A material deposition apparatus for depositing an evaporated material onto a substrate, the material deposition apparatus comprising:
   a substrate transportation device comprising a coating drum comprising a curved drum surface and configured to transport the substrate along a substrate transportation direction, the coating drum being a gas cushion coating drum configured to provide a cooling gas between the drum surface and the substrate;
   an evaporation source assembly disposed along the substrate transportation direction to provide the evaporated material to the substrate, the evaporation source assembly having a deposition area and wherein the substrate transportation device is configured to transport the substrate on the curved drum surface past the evaporation source assembly; and
   at least a first heating assembly disposed along the substrate transportation direction, the first heating assembly being configured to provide a first heating area for heating the substrate, the first heating area being located directly adjacent to the deposition area of the evaporation source assembly;
   wherein:
   the evaporation source assembly further comprises at least one temperature-controlled shield arranged at the evaporation source assembly and delimiting the deposition area of the evaporation source assembly between a starting point of the deposition area and an end point of the deposition area;
   at least part of the first heating area being located such that the substrate is simultaneously cooled by the cooling gas between the drum surface and the substrate such that heat is removed from the substrate to allow for higher deposition rates without damaging the substrate, and heated by the first heating assembly when the substrate is in the first heating area; and
   the substrate directly enters the deposition area at the starting point of the deposition area when exiting the first heating area.

2. The material deposition apparatus according to claim 1, wherein the at least one temperature-controlled shield extends outward the evaporation source assembly and towards the substrate.

3. The material deposition apparatus according to claim 1, the first heating assembly comprising:

a first heating element configured to provide a first heating zone having a first temperature and
   a second heating element configured to provide a second heating zone having a second temperature, the first temperature being different from the second temperature, the first heating element and the second heating element being individually controllable.

4. The material deposition apparatus according to claim 3, wherein at least one of the first heating element and the second heating element includes a graphite heater.

5. The material deposition apparatus according to claim 1, wherein the first heating assembly is configured to pre-heat the substrate.

6. The material deposition apparatus according to claim 1, further comprising:
   at least a second heating assembly disposed along the substrate transportation direction, the second heating assembly being configured to provide a second heating area for heating the substrate directly adjacent to the end point of the deposition area.

7. The material deposition apparatus according to claim 6, the second heating assembly comprising:
   a first heating element configured to provide a first heating zone having a first temperature; and
   a second heating element configured to provide a second heating zone having a second temperature, the first temperature being different from the second temperature, the first heating element and the second heating element being individually controllable.

8. The material deposition apparatus according to claim 6, wherein the second heating assembly is configured to post-heat the substrate.

9. The material deposition apparatus according to claim 1, wherein a distance between the starting point of the deposition area and the first heating area and/or a distance between the end point of the deposition area and a second heating area are less than 1 cm, particularly less than 0.5 cm.

10. The material deposition apparatus according to claim 1, the evaporation source assembly comprising
    a first evaporation source having a first deposition area for depositing a first material onto the substrate and a second evaporation source having a second deposition area for depositing the first material or a second material onto the substrate.

11. The material deposition apparatus according to claim 10, further comprising at least a second heating assembly disposed along the substrate transportation direction, wherein the first heating assembly and the second heating assembly are provided on opposite sides of the first and/or the second evaporation source along the substrate transportation direction.

12. The material deposition apparatus according to claim 1, wherein the evaporation source includes one or more crucibles for material evaporation and a distributor with a plurality of nozzles for providing the evaporated material to the substrate.

* * * * *